United States Patent
Sun

(10) Patent No.: US 10,374,062 B2
(45) Date of Patent: Aug. 6, 2019

(54) ARRAY SUBSTRATE, MANUFACTURING METHOD THEREOF AND DISPLAY PANEL

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Yanfei Sun, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

(*) Notice: Subject to any disclaimer, the term of this patent is extended or adjusted under 35 U.S.C. 154(b) by 53 days.

(21) Appl. No.: 15/519,954

(22) PCT Filed: May 23, 2016

(86) PCT No.: PCT/CN2016/082966
§ 371 (c)(1),
(2) Date: Apr. 18, 2017

(87) PCT Pub. No.: WO2017/152502
PCT Pub. Date: Sep. 14, 2017

(65) Prior Publication Data
US 2018/0097087 A1    Apr. 5, 2018

(30) Foreign Application Priority Data
Mar. 9, 2016   (CN) .......................... 2016 1 0133351

(51) Int. Cl.
*H01L 29/66*   (2006.01)
*H01L 21/77*   (2017.01)
(Continued)

(52) U.S. Cl.
CPC .. *H01L 29/66757* (2013.01); *G02F 1/136227* (2013.01); *H01L 21/76804* (2013.01);
(Continued)

(58) Field of Classification Search
CPC ... H01L 29/66; H01L 21/76804; H01L 21/77; H01L 23/5283
See application file for complete search history.

(56) References Cited

U.S. PATENT DOCUMENTS 4,814,041 A * 3/1989 Auda ................ H01L 21/31116
                                                    257/E21.252
6,396,078 B1 * 5/2002 Uochi ............... H01L 21/76804
                                                    257/347

(Continued)

FOREIGN PATENT DOCUMENTS

CN    1509127 A    6/2004
CN    1945855 A    4/2007
(Continued)

OTHER PUBLICATIONS

First Office Action dated Dec. 28, 2017, of corresponding application CN 201610133351.9 with English translation.
(Continued)

*Primary Examiner* — Thao P Le
(74) *Attorney, Agent, or Firm* — Nath, Goldberg & Meyer; Joshua B. Goldberg

(57) ABSTRACT

The present invention provides an array substrate, a manufacturing method thereof and a display panel. The array substrate includes a substrate and an insulation layer provided on the substrate, the insulation layer including a via therein formed by etching. The insulation layer further includes a plurality of insulation sub-layers stacked on each other, and an insulation sub-layer among the plurality of insulation sub-layers which is farther away from the sub-
(Continued)

strate has a larger etching rate under an etching condition for forming the via.

14 Claims, 2 Drawing Sheets

(51) Int. Cl.
| | | |
|---|---|---|
| *H01L 27/12* | (2006.01) | |
| *G02F 1/1362* | (2006.01) | |
| *H01L 21/768* | (2006.01) | |
| *H01L 23/528* | (2006.01) | |
| *H01L 23/532* | (2006.01) | |
| *H01L 29/417* | (2006.01) | |
| *H01L 29/423* | (2006.01) | |

(52) U.S. Cl.
CPC .......... *H01L 21/77* (2013.01); *H01L 23/5283* (2013.01); *H01L 23/5329* (2013.01); *H01L 27/12* (2013.01); *H01L 27/1248* (2013.01); *H01L 29/41733* (2013.01); *H01L 29/42384* (2013.01)

(56) References Cited

U.S. PATENT DOCUMENTS

| | | |
|---|---|---|
| 7,683,375 B2 | 3/2010 | Tanaka |
| 7,871,846 B2 | 1/2011 | Tanaka |
| 8,129,902 B2 | 3/2012 | Kai et al. |
| 8,610,871 B2 | 12/2013 | Tanaka et al. |
| 2004/0119419 A1 | 6/2004 | Kai et al. |
| 2007/0064486 A1* | 3/2007 | Sung .................. H01L 27/3246 365/185.13 |
| 2010/0271582 A1* | 10/2010 | Yamakawa ....... G02F 1/136227 349/138 |

FOREIGN PATENT DOCUMENTS

| | | |
|---|---|---|
| CN | 101546746 A | 9/2009 |
| CN | 101677104 A | 3/2010 |
| CN | 101789402 A | 7/2010 |
| CN | 104835827 A | 8/2015 |
| CN | 105552091 A | 5/2016 |
| JP | S63-34928 A | 2/1988 |

OTHER PUBLICATIONS

International Search report dated Nov. 25, 2016 in corresponding International Application No. PCT/CN2016/082966 along with an English translation of the International Search Report and an English translation of the Written Opinion of the International Searching Authority.

Chinese office action dated Jul. 13, 2018 for corresponding application No. 201610133351.9 with English translation attached.

* cited by examiner

ARRAY SUBSTRATE, MANUFACTURING METHOD THEREOF AND DISPLAY PANEL

This is a National Phase Application filed under 35 U.S.C. 371 as a national stage of PCT/CN2016/082966, filed May 23, 2016, an application claiming the benefit of Chinese Application No. 201610133351.9, filed Mar. 9, 2016, the content of each of which is hereby incorporated by reference in its entirety.

FIELD OF THE INVENTION

The present invention relates to the field of display technology, and in particular, relates to an array substrate, a manufacturing method thereof and a display panel.

BACKGROUND OF THE INVENTION

In an existing array substrate of a liquid crystal display device, a thin film transistor has a passivation layer (PVX) 1 covering thereon, and a pixel electrode 7 is provided on the passivation layer 1 and connected to a drain 8 of the thin film transistor through a via 19 in the passivation layer 1, as shown in FIG. 1.

The via 19 in the passivation layer 1 is formed by an etching process. The via 19 has a larger upper end and a smaller lower end due to the characteristics of the etching process, and thus has a slope angle α which is an angle between the upper surface of a substrate 9 and a sidewall of the via. Since an upper surface of the drain 8 is parallel to the upper surface of the substrate 9, the slope angle α is shown as an angle between the upper surface of the drain 8 and the sidewall of the via. The slope angle α formed by an existing etching process is so large (i.e., a sidewall of the via being approximately perpendicular to the upper surface of the substrate 9) that the pixel electrode 7 is prone to break (as shown by a cross in FIG. 1) at a position of the via 19, causing the pixel electrode 7 to be unable to transmit a signal. As a result, problems such as poor display occur.

SUMMARY OF THE INVENTION

In view of the above technical problems due to the fact that the slope angle of the via in an insulation layer of an array substrate in the prior art is too large, an object of the present invention is to provide an array substrate, a manufacturing method thereof and a display panel, wherein a via in an insulation layer has a small slope angle.

Embodiments of the present invention provide an array substrate, which includes a substrate and an insulation layer provided on the substrate, the insulation layer including a via therein formed by etching, wherein, the insulation layer includes a plurality of insulation sub-layers stacked on each other, and an insulation sub-layer among the plurality of insulation sub-layers which is farther away from the substrate has a larger etching rate under an etching condition for forming the via.

Herein, the "etching rate" of an insulation sub-layer refers to a thickness of a portion of the insulation sub-layer which is removed by etching within a unit of time. A larger etching rate of an insulation sub-layer means that the insulation sub-layer is faster removed by etching. It should be noted that a same insulation sub-layer may have different etching rates under different etching conditions. In the present invention, the etching rates of the insulation sub-layers are required to be such that an insulation sub-layer which is farther away from the substrate has a larger etching rate under a same etching condition.

Optionally, the insulation layer consists of a first insulation sub-layer and a second insulation sub-layer provided on a side of the first insulation sub-layer far away from the substrate.

Further optionally, under the etching condition for forming the via, the first insulation sub-layer has an etching rate ranging from 6000 Å/min to 7000 Å/min, and the second insulation sub-layer has an etching rate ranging from 8000 Å/min to 12000 Å/min.

Further optionally, a ratio of a thickness of the first insulation sub-layer to that of the second insulation sub-layer is equal to or greater than 4:1.

Further optionally, the thickness of the first insulation sub-layer ranges from 800 Å to 1700 Å, and the thickness of the second insulation sub-layer ranges from 200 Å to 300 Å.

Optionally, each of the plurality of insulation sub-layers is a silicon nitride-containing layer, and an insulation sub-layer which is farther away from the substrate has a smaller ratio of the number of silicon-nitride bonds to that of silicon-hydrogen bonds.

Optionally, the insulation layer is a passivation layer, the array substrate further includes a thin film transistor covered by the insulation layer and located on the substrate, and a pixel electrode provided on a side of the insulation layer far away from the substrate, the pixel electrode being connected to a drain of the thin film transistor through the via in the insulation layer.

Embodiments of the present invention provide a display panel, which includes the array substrate as described above.

Embodiments of the present invention provide a manufacturing method of an array substrate. The manufacturing method includes steps of forming a plurality of insulation sub-layers stacked on each other on a substrate sequentially, so that the plurality of insulation sub-layers form an insulation layer, and an insulation sub-layer among the plurality of insulation sub-layers which is farther away from the substrate has a larger etching rate; and etching the plurality of insulation sub-layers of the insulation layer to form a via, under a same etching condition.

Herein, "an insulation sub-layer among the plurality of insulation sub-layers which is farther away from the substrate has a larger etching rate" means that, of any two insulation sub-layers, one insulation sub-layer which is farther away from the substrate has a larger etching rate than that of the other insulation sub-layer which is closer to the substrate, but does not means that different portions of a same insulation sub-layer have different etching rates.

Optionally, each of the plurality of insulation sub-layers is a silicon nitride-containing layer, and an insulation sub-layer which is farther away from the substrate has a smaller ratio of the number of silicon-nitride bonds to that of silicon-hydrogen bonds.

Optionally, each of the plurality of insulation sub-layers is formed by a plasma-enhanced chemical vapor deposition process, wherein a mixed gas of silane and ammonia gas is used as a process gas, and the plurality of insulation sub-layers are formed under at least one of the following conditions:

C1: when an insulation sub-layer which is farther away from the substrate is formed, a flow amount of silane, a flow amount of ammonia gas and a ratio of the flow amount of silane to the flow amount of ammonia gas are smaller; and C2: when an insulation sub-layer which is farther away from the substrate is formed, a radio frequency power of plasma is smaller.

In the array substrate according to the present, the insulation layer includes at least two insulation sub-layers having different etching rates, and an insulation sub-layer which is at a higher level (i.e., is farther away from the substrate) has a larger etching rate. The inventor of the present invention found that, such an insulation layer having a predetermined etching rate can be etched to have a via having a small slope angle therein, facilitating a conductive structure on the insulation layer being connected to another conductive structure under the insulation layer through the via. As a result, the conductive structure on the insulation layer is prevented from having defects such as breakage due to the slope angle of the via being too large.

DESCRIPTION OF REFERENCE SIGNS

α—slope angle, 1—passivation layer, 11—first insulation sub-layer, 12—second insulation sub-layer, 7—pixel electrode, 8—drain, 9—substrate.

DETAILED DESCRIPTION OF THE EMBODIMENTS

For better understanding of the technical solutions of the present invention by a person skilled in the art, embodiments of the present invention will be described in further detail below with reference to the accompanying drawings.

First Embodiment

Figure 1:
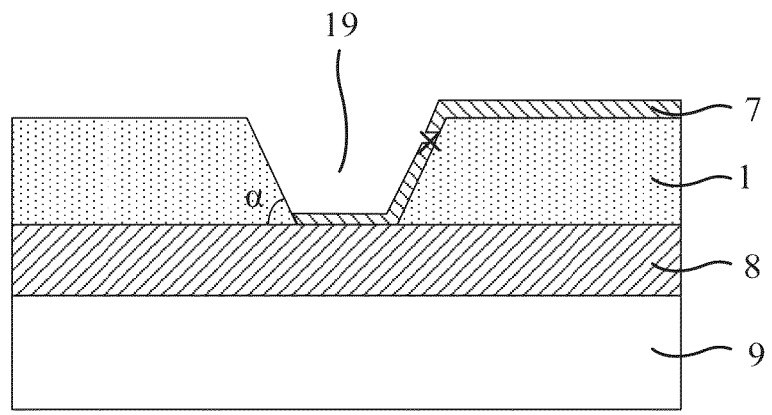
FIG. 1 is a schematic sectional view showing a portion of an array substrate including a via in the prior art.
Figure 2:
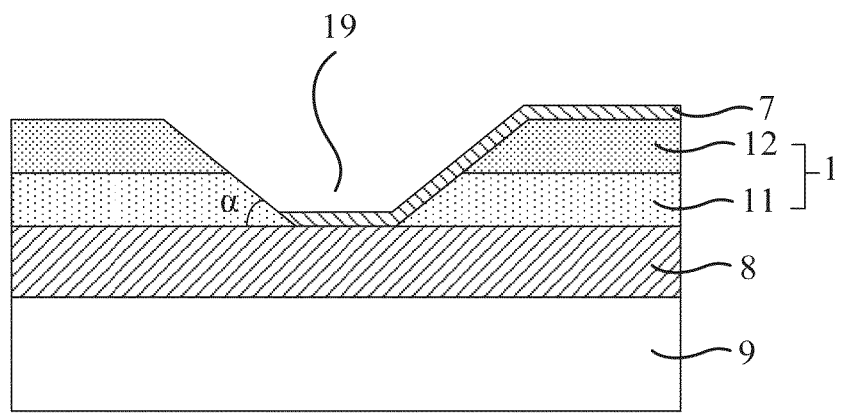
FIG. 2 is a schematic sectional view showing a portion of an array substrate including a via according to an embodiment of the present invention.
Figure 4:
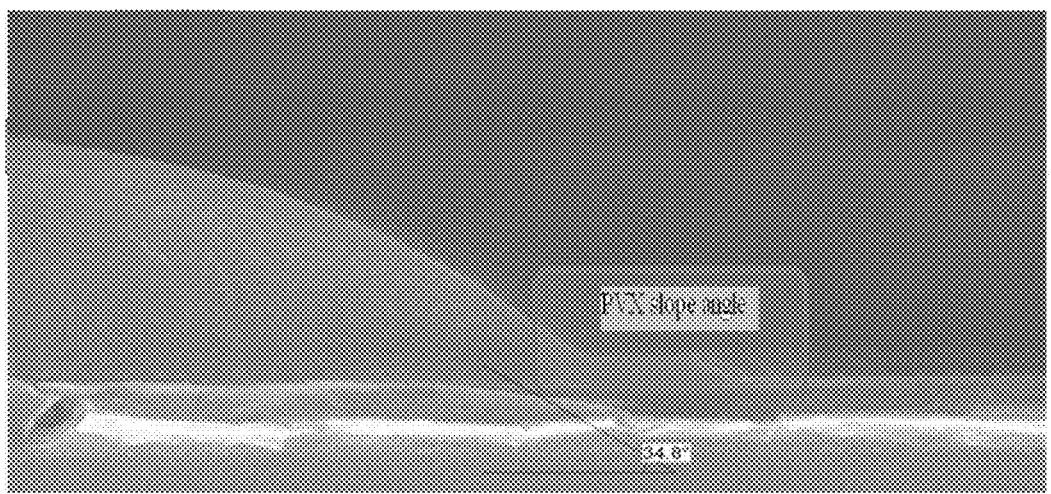
FIG. 4 is a scanning electron photomicrograph of a section of the portion of an array substrate including a via according to an embodiment of the present invention.

The present embodiment provides an array substrate, as shown in FIGS. 2 and 4.

The array substrate is applicable to display devices such as a liquid crystal display device, an organic light emitting diode (OLED) display device, and the like. These display devices may have various specific structures known to a person skilled in the art, which will be omitted herein.

The array substrate according to the present embodiment includes a substrate 9 and an insulation layer provided on the substrate 9, the insulation layer including a via 19 therein formed by etching. The insulation layer includes a plurality of insulation sub-layers stacked on each other, and an insulation sub-layer among the plurality of insulation sub-layers which is farther away from the substrate 9 has a larger etching rate under an etching condition for forming the via 19.

That is, the array substrate must have an insulation layer (e.g., a passivation layer 1) therein, regardless of the details of other components of the array substrate. The insulation layer is configured to separate conductive structures respectively provided on the upper and lower sides of the insulation layer from each other. The via 19 is provided in the insulation layer, and configured to connect the conductive structures (e.g., a pixel electrode 7 and a drain 8 of a thin film transistor) respectively provided on the upper and lower sides of the insulation layer to each other at a desired position. Different from a conventional insulation layer, the insulation layer according to the present invention, which is a single functional layer, includes a plurality of insulation sub-layers, wherein the insulation sub-layers can be etched by different rates under a same etching condition. In particular, an insulation sub-layer which is at a higher level (i.e., is farther away from the substrate 9) can be etched by a greater etching rate, i.e., an insulation sub-layer which is farther away from the substrate 9 has a larger etching rate.

Herein, "a single functional layer" means that the insulation layer as a whole functions as one layer, and thus the insulation layer does not have any other structure between the insulation sub-layers. For a conventional insulation layer in which two insulation sub-layers have other structure therebetween, the two insulation sub-layers may be in direct contact with each other at some positions. However, such two insulation sub-layers in direct contact with each other at some positions will not included in the insulation layer according to the present invention.

In the array substrate according to the present embodiment, the insulation layer includes at least two insulation sub-layers having different etching rates, and the insulation sub-layer at a higher level has a greater etching rate. The inventor of the present invention found that, such an insulation layer having a predetermined etching rate (i.e., the insulation layer of which an insulation sub-layer which is farther away from the substrate 9 has a greater etching rate) can be etched to have the via 19 having a small slope angle α therein, facilitating a conductive structure on the insulation layer being connected to another conductive structure under the insulation layer through the via 19. As a result, the conductive structure on the insulation layer is prevented from having defects such as breakage due to the slope angle of the via 19 being too large.

Optionally, the insulation layer is the passivation layer 1. The array substrate further includes a thin film transistor covered by the insulation layer and located on the substrate 9 and the pixel electrode 7 provided on a side of the insulation layer (e.g., the passivation layer 1) far away from the substrate 9, and the pixel electrode 7 is connected to the drain 8 of the thin film transistor through the via 19 in the insulation layer.

That is, the insulation layer according to the present embodiment is applicable to an array substrate of a liquid crystal display device. In this case, the insulation layer is a passivation layer (PVX) 1. The passivation layer 1 covers the thin film transistor, and the pixel electrode 7 is provided on the passivation layer 1 and is connected to the drain 8 of the thin film transistor through the via 19. Generally, the passivation layer 1 has a large thickness, whereas the pixel electrode 7 has a small thickness. Thus, in the case where the pixel electrode 7 is connected to the drain 8 through the via 19 in the passivation layer 1 (i.e., the pixel electrode 7 extends to a portion of a surface of the drain 8 which is exposed by the via 19), the pixel electrode 7 is prone to break if the slope angle α of the via 19 is too large. The insulation layer (e.g., the passivation layer 1) according to the present invention enables the slope angle α of the via 19 to be small, making the pixel electrode 7 not be prone to break. In FIG. 2, the pixel electrode 7 is provided on the passivation layer 1, but the present invention is not limited thereto.

It is easily appreciated that the array substrate according to the present invention may further include a gate (a gate line), a gate insulation layer, an active layer, a source (a data line), a common electrode, and the like according to a practical application, description thereof is omitted herein.

It should be noted that the array substrate according to the present embodiment is not limited to an array substrate of a liquid crystal display device, and may be an array substrate of devices such as an OLED display device. Further, the insulation layer of the array substrate is not limited to the passivation layer 1, and may be an insulation layer as long as a via (e.g., the via 19) is formed in this insulation layer by etching. For example, the insulation layer may be a gate insulation layer, a planarization layer, or the like.

Optionally, each of the plurality of insulation sub-layers is a silicon nitride-containing layer (i.e., a layer containing silicon nitride), and an insulation sub-layer which is farther away from the substrate 9 has a smaller ratio of the number of silicon-nitride bonds to that of silicon-hydrogen bonds.

It is found that, an actual silicon nitride-containing layer inherently includes silicon-nitride bonds (Si—N) and silicon-hydrogen bonds (Si—H). For the actual silicon nitride-containing layer, silicon-hydrogen bonds are "impurities" in some sense. Thus, in a case where the number of silicon-hydrogen bonds is larger, the silicon nitride-containing layer has more defects, and can be etched easier (i.e., has a larger etching rate). To achieve an insulation sub-layer which is at a higher level (i.e., is farther away from the substrate 9) having a larger etching rate, an insulation sub-layer which is at a higher level has a smaller ratio of the number of silicon-nitride bonds to that of silicon-hydrogen bonds (i.e., has a smaller number of silicon-nitride bonds and a larger number of silicon-hydrogen bonds).

Herein, silicon nitride-containing layers having different ratios of the number of silicon-nitride bonds to that of silicon-hydrogen bonds may be formed by a same process, as long as parameters of the process are adjusted. For example, in a case where the silicon nitride-containing layer is formed by a plasma-enhanced chemical vapor deposition (PECVD) process, a ratio of the number of silicon-nitride bonds to that of silicon-hydrogen bonds may be changed by adjusting a flow amount of a process gas, a radio frequency (RF) power of plasma, a temperature, a pressure, and/or the like.

It should be noted that, the insulation sub-layer is not limited to a silicon nitride-containing layer, and may be made of another material such as silicon oxide and silicon oxynitride. Alternatively, different insulation sub-layers may be made of different materials, as long as the insulation sub-layers have etching rates fulfilling the above requirement, i.e., an insulation sub-layer which is farther away from the substrate 9 has a greater etching rate.

Optionally, the insulation layer only includes a first insulation sub-layer 11 and a second insulation sub-layer 12 provided on a side of the first insulation sub-layer 11 far away from the substrate 9.

That is, alternatively, the insulation layer (e.g., the passivation layer 1) may only includes the first and second insulation sub-layers 11 and 12, and the second insulation sub-layer 12 has a larger etching rate than that of the first insulation sub-layer 11 under a same etching condition. It is easily appreciated that the larger the number of the insulation sub-layers is, the more complicated the manufacturing process is. It is found that, only two insulation sub-layers can achieve the effect of effectively reducing of the slope angle α. Thus, the insulation layer may only include two insulation sub-layers.

Further optionally, under the etching condition for forming the via 19, the first insulation sub-layer 11 has an etching rate ranging from 6000 Å/min to 7000 Å/min, and the second insulation sub-layer 12 has an etching rate ranging from 8000 Å/min to 12000 Å/min.

In particular, It is found that, in a case where the insulation layer (e.g., the passivation layer 1) consists of two insulation sub-layers, the slope angle α of the via 19 can be effectively reduced by controlling the etching rates of the two insulation sub-layers into the above ranges, respectively.

Optionally, a ratio of a thickness of the first insulation sub-layer 11 to that of the second insulation sub-layer 12 is equal to or greater than 4:1. Further optionally, the thickness of the first insulation sub-layer 11 ranges from 800 Å to 1700 Å, and the thickness of the second insulation sub-layer 12 ranges from 200 Å to 300 Å.

The relationship between the thicknesses of the two insulation sub-layers also has an influence on the slope angle α of the via 19. It is found that, the slope angle α of the via 19 can be reduced effectively in a case where the second insulation sub-layer 12 has a smaller thickness. The relationship between the thicknesses of the first and second insulation sub-layers 11 and 12 can be the case described above.

It should be noted that, the insulation layer is not limited to including only two insulation sub-layers, and may include a third insulation sub-layer, a fourth insulation sub-layer, and the like sequentially provided on the second insulation sub-layer, as long as each of the insulation sub-layers has an etching rate fulfilling the above requirement, i.e., an insulation sub-layer which is farther away from the substrate 9 has a larger etching rate.

The present embodiment further provides a manufacturing method of the array substrate as described above, as shown in FIGS. 2 and 4. The manufacturing method includes the following steps S1 and S2.

S1: forming a plurality of insulation sub-layers stacked on each other on the substrate 9 sequentially, so that the plurality of insulation sub-layers form an insulation layer, and an insulation sub-layer among the plurality of insulation sub-layers which is farther away from the substrate has a larger etching rate; and S2: etching the plurality of insulation sub-layers of the insulation layer to form the via 19, under a same etching condition.

In particular, during manufacture of the array substrate, the plurality of insulation sub-layers (e.g., the first insulation sub-layer 11 and the second insulation sub-layer 12) stacked on each other are formed sequentially first, and then the via 19 is formed in the plurality of insulation sub-layers of the insulation layer by a single etching process under a same etching condition. Since each of the insulation sub-layers has an etching rate fulfilling the above requirement, the resultant via 19 has a significantly smaller slope angle α than that of the via 19 formed in an insulation layer made of a uniform material.

Herein, etching can be performed by a conventional process such as dry etching process, wherein sulfur hexafluoride ($SF_6$) gas and ozone ($O_3$) gas are employed, and a molar ratio of sulfur hexafluoride to ozone is 1:2.

In particular, each of the plurality of insulation sub-layers is a silicon nitride-containing layer, and is formed by a plasma-enhanced chemical vapor deposition (PECVD) process, wherein a mixed gas of silane ($SiH_4$) and ammonia gas (NH$_3$) is used as a process gas, nitrogen (N$_2$) is used as a carrier gas, and the deposition apparatus is one of 20KPX type manufactured by AKT corporation. Further, the plurality of insulation sub-layers are formed under at least one of the following conditions C1 and C2.

C1: when an insulation sub-layer which is farther away from the substrate 9 is formed, a flow amount of silane, a flow amount of ammonia gas and a ratio of the flow amount of silane to the flow amount of ammonia gas are smaller. Such a condition can reduce a ratio of the number of silicon-nitride bonds to that of silicon-hydrogen bonds, thereby increasing the etching rate of the insulation sub-layer which is farther away from the substrate 9.

C2: when an insulation sub-layer which is farther away from the substrate 9 is formed, a radio frequency (RF) power of plasma is smaller. In the case where the radio frequency (RF) power of plasma is smaller, the resultant insulation sub-layer is relatively loose and thus can be etched more easily, i.e., has a larger etching rate.

It should be noted that, in the PECVD process, an etching rate of an insulation sub-layer can be changed by adjusting other process parameters such as pressure, temperature, and the like. Alternatively, for another insulation sub-layer made by another material or formed by another process, an etching rate thereof can be controlled by adjusting other process parameters. Further alternatively, different insulation sub-layers may be made of materials having different etching rates. Thus, the result insulation sub-layers can be such layers that have etching rates fulfilling the above requirement (i.e., an insulation sub-layer which is farther away from the substrate 9 has a larger etching rate), and description of specific process types, process parameters and material of the insulation sub-layers is omitted herein.

Figure 3:
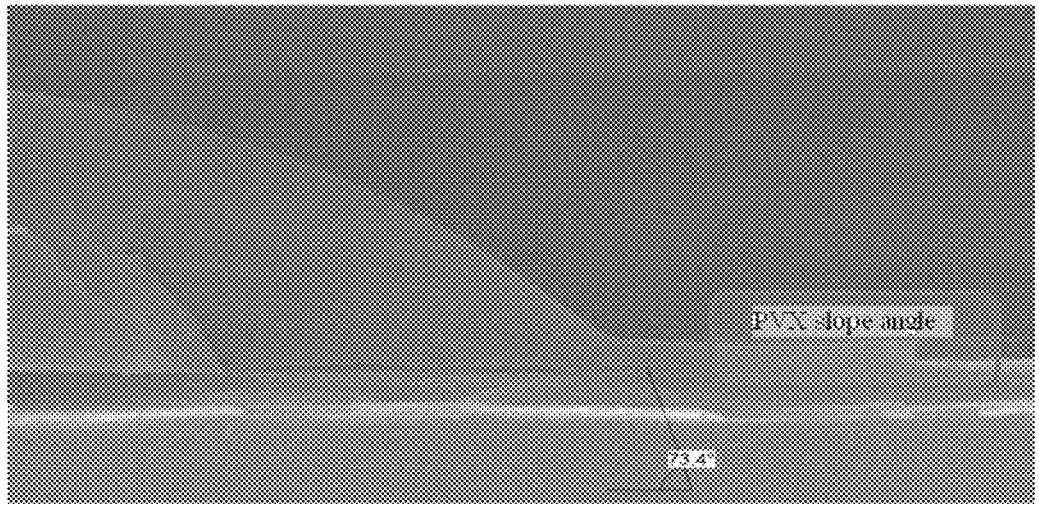
FIG. 3 is a scanning electron photomicrograph of a section of the portion of an array substrate including a via in the prior art.

As a comparative example, FIG. 3 is a scanning electron photomicrograph of a section of a portion of an array substrate including a via in the prior art, the portion including the via 19 in an insulation layer (e.g., a silicon nitride-containing layer). FIG. 3 shows the slope angle in the insulation layer of the existing array substrate. The slope angle α is an angle formed by edges of a thin layer in the frame labeled with "PVX slope angle" as shown in FIG. 3. Measurement showed that the insulation layer (which does not include a sub-layer) here has a thickness of 2000 Å, and has an etching rate of 6895 Å/min. An analysis on a section of the existing array substrate by using an electron microscopy showed that the slope angle α of the via 19 in the existing insulation layer is 73.4 degrees.

FIG. 4 is a scanning electron photomicrograph of a section of a portion of an array substrate according to the present embodiment, the portion including the via 19 in an insulation layer. The slope angle α is an angle formed by edges of a thin layer in the frame labeled with "PVX slope angle" as shown in FIG. 4. In FIG. 4, the insulation layer consists of the first insulation sub-layer (silicon nitride-containing layer) 11 and the second insulation sub-layer (silicon nitride-containing layer) 12. Measurement showed that, the first insulation sub-layer 11 has a thickness of 1300 Å, and the second insulation sub-layer 12 has a thickness of 200 Å. The measurement also showed that, the first insulation sub-layer 11 has an etching rate of 6954 Å/min, and the second insulation sub-layer 12 has an etching rate of 11960 Å/min. An analysis on a section of the array substrate according to the present embodiment by using an electron microscopy showed that the slope angle α of the via 19 in the insulation layer according to the present embodiment is 34.8 degrees.

Thus, it is feasible to effectively reduce the slope angle α of the via 19 in the insulation layer by dividing the insulation layer into a plurality of insulation sub-layers having a predetermined relationship of etching rate. In this way, a conductive structure on the insulation layer is prevented from having defects such as breakage, thereby achieving a better display effect.

Second Embodiment

The present embodiment provides a display panel, which includes the array substrate according to the first embodiment.

In particular, the display panel may be a liquid crystal display panel or an OLED panel, and is applicable to any product having a display function, such as electronic paper, a mobile phone, a tablet computer, a television, a display, a laptop computer, a digital photo frame, a navigator, and the like.

It should be understood that, the above embodiments are only exemplary embodiments for the purpose of explaining the principle of the present invention, but the present invention is not limited thereto. For a person having ordinary skill in the art, various improvements and modifications may be made without departing from the spirit and essence of the present invention. These improvements and modifications also fall within the protection scope of the present invention.

What is claimed is:

1. An array substrate, comprising a substrate and an insulation layer provided on the substrate, the insulation layer comprising a via therein formed by etching, wherein
the insulation layer comprises a plurality of insulation sub-layers stacked on each other, and an insulation sub-layer among the plurality of insulation sub-layers which is farther away from the substrate has a larger etching rate under an etching condition for forming the via;
each of the plurality of insulation sub-layers is a silicon nitride-containing layer; and
an insulation sub-layer which is farther away from the substrate has a smaller ratio of the number of silicon-nitride bonds to that of silicon-hydrogen bonds.

2. The array substrate according to claim 1, wherein
the insulation layer consists of a first insulation sub-layer and a second insulation sub-layer provided on a side of the first insulation sub-layer far away from the substrate.

3. The array substrate according to claim 2, wherein
under the etching condition for forming the via, the first insulation sub-layer has an etching rate ranging from 6000 Å/min to 7000 Å/min, and the second insulation sub-layer has an etching rate ranging from 8000 Å/min to 12000 Å/min.

4. The array substrate according to claim 2, wherein
a ratio of a thickness of the first insulation sub-layer to that of the second insulation sub-layer is equal to or greater than 4:1.

5. The array substrate according to claim 4, wherein
the thickness of the first insulation sub-layer ranges from 800 Å to 1700 Å, and the thickness of the second insulation sub-layer ranges from 200 Å to 300 Å.

6. The array substrate according to claim 1, wherein the insulation layer is a passivation layer, and
the array substrate further comprises a thin film transistor covered by the insulation layer and located on the substrate, and a pixel electrode provided on a side of the insulation layer far away from the substrate, the pixel electrode being connected to a drain of the thin film transistor through the via in the insulation layer.

7. A display panel, comprising an array substrate, which comprises a substrate and an insulation layer provided on the substrate, the insulation layer comprising a via therein formed by etching, wherein the insulation layer comprises a plurality of insulation sub-layers stacked on each other, and an insulation sub-layer among the plurality of insulation sub-layers which is farther away from the substrate has a larger etching rate under an etching condition for forming the via;

each of the plurality of insulation sub-layers is a silicon nitride-containing layer; and an insulation sub-layer which is farther away from the substrate has a smaller ratio of the number of silicon-nitride bonds to that of silicon-hydrogen bonds.

8. A manufacturing method of an array substrate, comprising steps of forming a plurality of insulation sub-layers stacked on each other on a substrate sequentially, so that the plurality of insulation sub-layers form an insulation layer, and an insulation sub-layer among the plurality of insulation sub-layers which is farther away from the substrate has a larger etching rate; and etching the plurality of insulation sub-layers of the insulation layer to form a via, under a same etching condition;

wherein each of the plurality of insulation sub-layers is a silicon nitride-containing layer, and an insulation sub-layer which is farther away from the substrate has a smaller ratio of the number of silicon-nitride bonds to that of silicon-hydrogen bonds.

9. The manufacturing method according to claim 8, wherein, each of the plurality of insulation sub-layers is formed by a plasma-enhanced chemical vapor deposition process, wherein a mixed gas of silane and ammonia gas is used as a process gas, and the plurality of insulation sub-layers are formed under at least one of the following conditions:

C1: when an insulation sub-layer which is farther away from the substrate is formed, a flow amount of silane, a flow amount of ammonia gas and a ratio of the flow amount of silane to the flow amount of ammonia gas are smaller; and C2: when an insulation sub-layer which is farther away from the substrate is formed, a radio frequency power of plasma is smaller.

10. The display panel according to claim 7, wherein the insulation layer consists of a first insulation sub-layer and a second insulation sub-layer provided on a side of the first insulation sub-layer far away from the substrate.

11. The display panel according to claim 10, wherein under the etching condition for forming the via, the first insulation sub-layer has an etching rate ranging from 6000 Å/min to 7000 Å/min, and the second insulation sub-layer has an etching rate ranging from 8000 Å/min to 12000 Å/min.

12. The display panel according to claim 10, wherein a ratio of a thickness of the first insulation sub-layer to that of the second insulation sub-layer is equal to or greater than 4:1.

13. The display panel according to claim 12, wherein the thickness of the first insulation sub-layer ranges from 800 Å to 1700 Å, and the thickness of the second insulation sub-layer ranges from 200 Å to 300 Å.

14. The display panel according to claim 7, wherein the insulation layer is a passivation layer, and the array substrate further comprises a thin film transistor covered by the insulation layer and located on the substrate, and a pixel electrode provided on a side of the insulation layer far away from the substrate, the pixel electrode being connected to a drain of the thin film transistor through the via in the insulation layer.

* * * * *